United States Patent [19]

Meyer et al.

[11] Patent Number: 6,154,160
[45] Date of Patent: Nov. 28, 2000

[54] CIRCUIT ARRANGEMENT INCLUDING DIGITAL-TO-ANALOG CURRENT CONVERTERS

[75] Inventors: Robert Meyer; Othmar Pfarrkircher, both of Hamburg, Germany

[73] Assignee: U.S. Philips Corporation, New York, N.Y.

[21] Appl. No.: 09/253,085

[22] Filed: Feb. 19, 1999

[30] Foreign Application Priority Data

Feb. 25, 1998 [DE] Germany ................................ 198 07 856

[51] Int. Cl.$^7$ .................................................. H03M 1/62
[52] U.S. Cl. ........................................... 341/139; 341/144
[58] Field of Search ..................................... 341/144, 155, 341/139, 135, 136, 117, 126

[56] References Cited

U.S. PATENT DOCUMENTS

| | | | |
|---|---|---|---|
| 4,092,639 | 5/1978 | Schoeff | 341/144 |
| 4,168,528 | 9/1979 | Comer | 341/144 |
| 4,393,370 | 7/1983 | Hareyama | 341/144 |
| 4,766,328 | 8/1988 | Yang | 341/144 |
| 4,982,192 | 1/1991 | Murooka | 341/135 |
| 5,570,090 | 10/1996 | Cummins | 341/144 |

*Primary Examiner*—Howard L. William
*Assistant Examiner*—Jean Bruner Jeanglaude
*Attorney, Agent, or Firm*—Tony E. Piotrowski

[57] ABSTRACT

A circuit checks the value and the existence of an external load of a digital-to-analog current converter. A first comparator compares a digital word to be converted, with a comparison data word. The output signal of the first converter indicates during which periods the digital data word is greater and during which periods it is smaller than the comparison data word. A second comparator compares the voltage at the output of the converter with a reference voltage. The output signal of the second converter indicates during which periods the output voltage is greater and during which periods it is smaller than the reference voltage. A comparison circuit checks the existence and the value of the output load by comparing the time periods indicated by the output signals of the two converters. Thus, a conclusion about the existence and the value of the output load is possible at any time.

10 Claims, 2 Drawing Sheets

CIRCUIT ARRANGEMENT INCLUDING DIGITAL-TO-ANALOG CURRENT CONVERTERS

BACKGROUND OF THE INVENTION

1. Field of the Invention

The invention relates to a circuit arrangement including digital-to-analog current converters whose output amplitudes depend on the value of a digital data word and whose output amplitude ranges depend on the value of a bias current applied to the respective converter.

2. Description of the Related Art

In digital-to-analog current converters, a digital data word is converted into analog form. This means that an analog output current is generated in dependence on the digital value of the data word. The value of the output current then changes according as the data words change.

Furthermore, it is known from U.S. Pat. No. 5,570,090 to vary, the bias current which is applied to the digital-to-analog current converter, in dependence on a control data word. The output amplitude range that can be obtained in dependence on the values of the data words can be set by an appropriate choice of the value of this bias current, which is otherwise constant. Thus, a kind of quasi-scaling is possible.

SUMMARY OF THE INVENTION

It is an object of the invention to provide a circuit arrangement including a plurality of digital-to-analog current converters, which, in the simplest possible way, enables the bias currents for a plurality of digital-to-analog current converters to be set and, moreover, provides a control means for the output amplitude range of at least one of the digital-to-analog current converters.

According to the invention this object is achieved in that there is provided at least one circuit for generating controlled bias currents whose values can be varied in dependence on at least a first data word, at least one of the digital-to-analog current converters is associated with a circuit for setting the output amplitude range, to which one of the controlled bias currents is applied and which supplies a weighted bias current for its associated digital-to-analog current converter, one of the controlled bias currents is applied to those of the digital-to-analog current converters which are not associated with a circuit for setting the output amplitude range, in the circuits for setting the output amplitude range the controlled bias current applied to them can be varied in dependence on an associated second data word, which results in the weighted bias current which is applied to the associated digital-to-analog current converter.

The bias current, which dictates the output amplitude range of the digital-to-analog current converter, should, in principle, be selected to be constant. However, the value of this bias current can be derived only from circuits which exhibit fluctuations in the values of their components, for example, caused by process variations in the fabrication of ICs. For example, the bias current can be derived from a band-gap voltage which is, in principle, relatively constant but which can be subject to a tolerance of ±3%.

In order to compensate for this tolerance, the arrangement in accordance with the invention includes a circuit for generating controlled bias currents. This circuit usually generates the same bias currents for all the digital-to-analog current converters provided in the circuit arrangement. Since, as explained above, the bias currents may not always have the desired value, the values of the bias currents are varied in dependence on a first data word. Thus, it is possible to set the bias currents exactly to a nominal value which is independent of process fluctuations and fluctuations of the relevant components. This is essential in order to ensure the desired operation of the digital-to-analog current converter. This means that, in the first place, it is assured that the output amplitude range of the digital-to-analog current converters, in dependence on the values of the data words, varies within a nominal range. This output amplitude range is the same for all those digital-to-analog current converters to which one of the controlled bias currents, generated by the circuit for generating controlled bias currents, is applied.

In addition to this, the circuit arrangement in accordance with the invention makes it possible to set the output amplitude ranges for the digital-to-analog current converters individually. This is effected by means of circuits for setting the output amplitude range. There is at least one circuit of this kind. Each individual one of said circuits is permanently associated with a digital-to-analog current converter and sets the output amplitude range of this converter. This is effected in that, in its turn, the controlled bias current, applied to the circuit for setting the output amplitude range and received from the circuit for generating controlled bias currents, is altered. This bias current is converted into a weighted bias current, which is applied to the associated digital-to-analog current converter. The conversion of the controlled bias current into the weighted bias current is effected in dependence on a second data word assigned to each of the circuits individually. Thus, the controlled bias current can be varied in dependence on the value of the second data word, which yields the weighted bias current. Thus, the output amplitude range of each digital-to-analog current converter can be set individually in dependence on a second data word, starting from bias currents having constant nominal values.

Moreover, the circuit arrangement has the advantage that the bias currents can be controlled for a plurality of converters in common. This means that only one circuit arrangement for generating controlled bias currents is required. Nevertheless, the output amplitude ranges of the digital-to-analog current converters can be set individually. By means of the embodiment in which the circuit for generating the controlled bias currents includes an operational amplifier having a non-inverting input to which a comparison voltage is applied and supplying an output signal in dependence on which the controlled bias currents and a reference current are generated, which reference current flows through a reference resistor and produces a voltage drop which is coupled to an inverting input of the operational amplifier, switchable weighted currents being superposable on the reference current in order to control the preferably equal controlled bias currents in dependence on a first control data word, it is achieved that in the circuit for generating the controlled bias currents, due to the arrangement of the operational amplifier and the feedback provided therein, the output signal of the operational amplifier assumes a constant value which depends, on the one hand, on the comparison voltage and, on the other hand, on the voltage drop across the reference resistance. Thus, by a suitable choice of the comparison voltage and/or the value of the reference resistor, the output amplitude of the operational amplifier can be set as required. However, since neither the comparison voltage nor the reference resistor always have the desired values, selectively weighted currents can be superposed on the reference current which flows through the reference resistor, the values of these weighted currents being dependent on the value of the first control data word. Thus, an accordingly altered voltage drop can be obtained across the reference resistor, which yields a correspondingly adapted output amplitude of the operational amplifier. This process, in the first place, serves to generate controlled bias currents for all the digital-to-analog current converters of the circuit arrangement, these bias currents preferably having equal magnitudes and, in particular, exhibiting a constant nominal value.

In a further embodiment of the invention the weighted output currents can be generated advantageously by means of MOS current mirrors.

A particularly advantageous control possibility is obtained by means of the further embodiment in which the weighted currents which are switchable in dependence on the first control data word are superposable on the reference current with the same sign and/or with different signs, because this allows a variation of the reference current, which flows through the reference resistor, with a different sign, i.e., with a positive or with a negative sign, as a result of which, the controlled bias currents can be corrected both in a positive sense and a negative sense in dependence on the value of the first control data word.

The controlled bias currents thus generated are applied to circuits for setting the output amplitude range, if present. Preferably, these circuits can be of a construction in which, for setting the output amplitude range, the controlled bias current received is applied to a MOS current mirror in which an output transistor supplies the unaltered controlled bias current and which includes further output transistors which supply weighted currents which are switchable in dependence on an associated second control data word and associated MOS transistors, which weighted currents are superposed on the controlled bias current so as to form the weighted bias current, which is applied to the respective associated digital-to-analog current converter. Again, MOS current mirrors are used by means of which a bias current identical to the input current, is generated. On this bias current further selectively weighted currents are superposed, thus enabling the controlled bias currents to be altered accordingly. The resulting currents provide the weighted bias currents which are applied to the respective associated digital-to-analog current converter. Thus, the bias currents can be varied in dependence on the second control data words so as to enable the desired output amplitude range of the respective associated digital-to-analog current converter to be set.

A further embodiment has the advantage that it enables the output amplitude ranges of all the digital-to-analog current converters to be set. The control and setting possibilities obtained by means of the circuit for generating controlled bias currents and the circuits for setting the output amplitude ranges, respectively, are preferably utilized in accordance with the further embodiments defined in in which the first control data word, which is applied to the circuit for generating the controlled bias currents, serves for correcting the values of the controlled bias currents in the case that these values deviate from a nominal value due to the reference voltage and/or the reference resistor having values which deviate from the nominal values, and in which the second control data words, which are associated with the digital-to-analog current converters or with the circuits for setting the output amplitude range which are associated with these converters, serve for setting amplitude ranges associated with data types converted by the digital-to-analog current converters.

Apart from the simple generation of the commonly controlled bias currents, the circuit arrangement in accordance with the invention has the advantage that it enables the output amplitude range of each digital-to-analog current converter to be set. This is particularly advantageous for uses where different output signals having different amplitudes should be generated in dependence on the data words. This can be employed advantageously in particular for the conversion of picture signals because this often requires the generation of different categories of picture signals with different amplitude ranges. Advantageous embodiment for this field of use.

BRIEF DESCRIPTION OF THE DRAWINGS

An embodiment of the invention will be described in more detail hereinafter by way of example. In the drawings.

DESCRIPTION OF THE PREFERRED EMBODIMENTS

Figure 1:
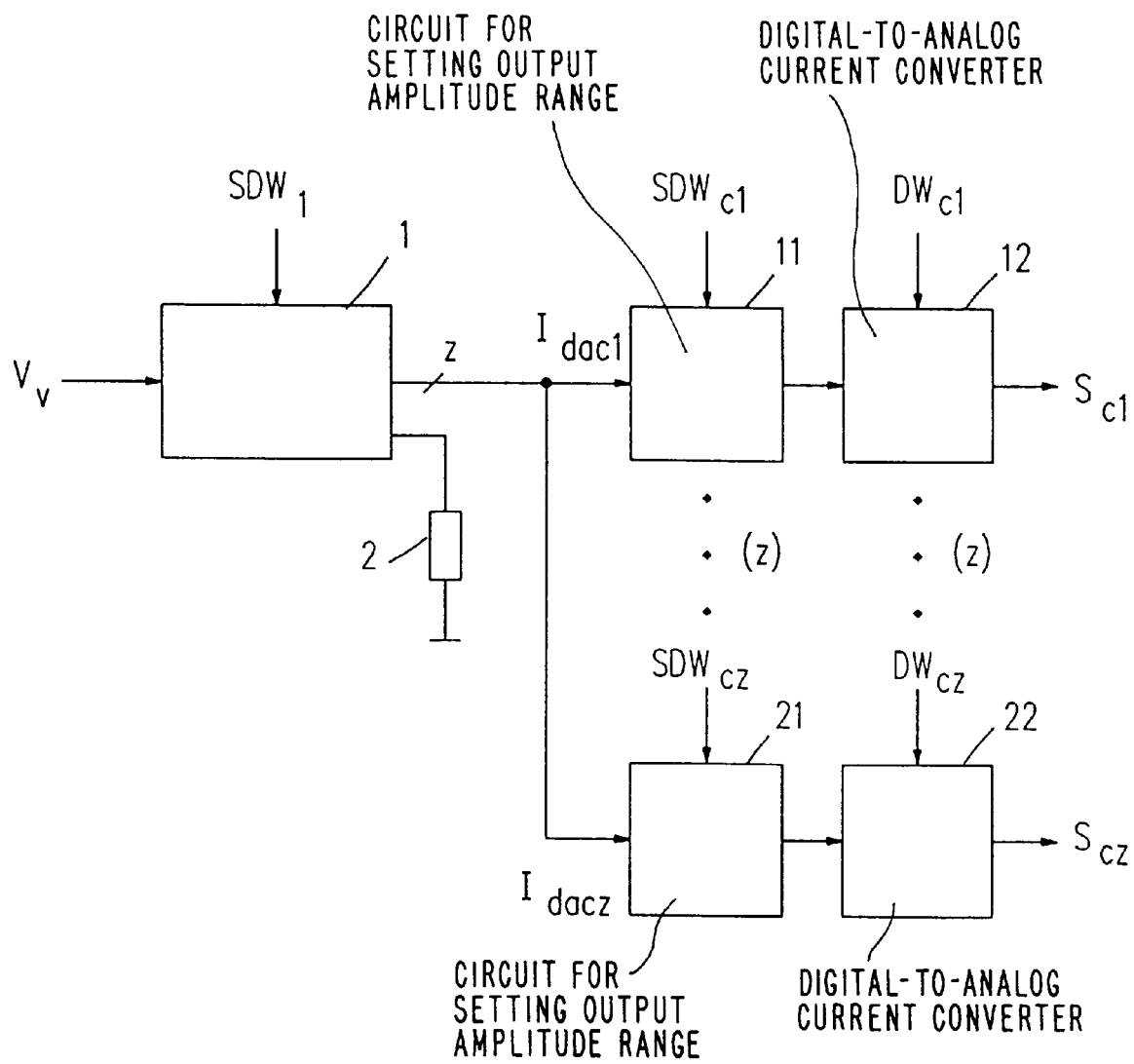
FIG. 1 shows a block diagram of a circuit arrangement in accordance with the invention including a plurality of digital-to-analog current converters, which are each associated with a circuit for setting the output amplitude range.

The block diagram in FIG. 1 shows a circuit 1 for generating controlled bias currents. At its input side, this circuit receives a comparison voltage $V_v$ as well as a first control data word $SDW_1$. Furthermore, an external reference resistor 2 is coupled to the circuit 1. In a manner described in more detail hereinafter, the circuit 1 generates a reference current, which flows through this reference resistor 2. Depending on the voltage drop across the reference resistor 2 as a result of this current and on the value of the comparison voltage $V_v$, controlled bias currents $I_{dac1}$ to $I_{dacz}$ are generated, the number of bias currents being dependent on the number z of digital-to-analog current converters included in the arrangement.

Since the values of the controlled, bias currents $I_{dac1}$ to $I_{dacz}$ depend both on the value of the reference resistor 2, which can be subject to fluctuations, and on the value of the comparison voltage $V_v$, a possibility of controlling the bias currents has been provided. As a result, it is achieved that, depending on the value of the first control data word $SDW_1$, the controlled bias currents $I_{dac1}$ to $I_{dacz}$ are variable in such manner that they can be set to a nominal value. Consequently, the value of the first control data word $SDW_1$ is selected in such a manner that the controlled bias currents $I_{dac1}$ to $I_{dacz}$ always have the nominal values, which should be obtained also if the reference resistor 2 or the comparison voltage $V_v$ does not have the desired value. The controlled bias currents thus generated ensure that the subsequent digital-to-analog current converters convert the data words applied to them exactly into the desired amplitude values at the output.

It is possible to apply said controlled bias currents directly to at least some of the digital-to-analog current converters. However, in accordance with the invention, there is provided at least one circuit 11 for setting the output amplitude range. The associated controlled bias current $I_{dac1}$ is applied to this circuit 11. In the circuit 11, this bias current becomes variable in dependence on an associated second control data word $SDW_{C1}$. In this way, a weighted bias current is generated, which is applied to the digital-to-analog current converter 12 associated with the circuit 11. Thus, the circuit 11 allows the controlled bias current $I_{dac1}$ to be varied in such a manner that this bias current can be changed into the weighted bias current in dependence on the second control data word $SDW_{C1}$. Thus, the output amplitude range of the digital-to-analog current converter 12 can be set individually. The actual amplitude of the output signal $S_{C1}$ of the digital-to-analog current converter 12 further depends on the actual data word $DW_{C1}$ to be converted. This data word to be converted dictates the instantaneous output amplitude. The overall output amplitude range covered in dependence on these data words is determined by means of the weighted bias currents.

In the embodiment shown in FIG. 1, each of the digital-to-analog current converters is preceded by a circuit for setting the output amplitude range. These circuits for setting the output amplitude range are fixedly allocated to the respective digital-to-analog current converters.

Thus, the arrangement in FIG. 1 includes a second digital-to-analog current converter 22 to which a data word $DW_{CZ}$ to be converted is applied. The digital-to-analog current converter 22 is fixedly associated with a circuit 21 for setting the output amplitude range of this converter. This circuit 21 receives a fixedly associated second control data word $SDW_{CZ}$.

The block diagram of FIG. 1 shows two digital-to-analog current converters 12 and 22, but it is possible to provide further converters.

The controlled bias currents having the nominal values can be varied so as to obtain the weighted bias currents by means of the associated circuits 11 and 21 (and any circuits associated with further digital-to-analog current converters), which is effected individually for each of the digital-to-analog current converters 12 and 22, the respective circuits 11 and 21 receiving individually selected control data words $SDW_{C1}$ and $SDW_{CZ}$ for setting the output amplitude range.

The circuit arrangement shown in FIG. 1 can serve, for example, for the conversion of digital video signals into analog video signals. In the analog domain, different voltage swings, occur for different types of video signals. For example, the voltage swings which appear across the resistors through which the output currents $S_{C1}$ and $S_{CZ}$ are passed, can be adjusted by means of the circuits 11 and 21 for setting the output amplitude range. For example, a voltage swing of 1 V is desired for video RGB signals, a voltage swing of 1.16 V is desired for video YC signals, and a voltage swing of 1.23 V is desired for video CVBS signals. These voltage swings, which are produced across external resistors, not shown in FIG. 1, can be controlled by means of control data words $SDW_{C1}$ to $SDW_{CZ}$. In the circuit arrangement in accordance with the invention, it is thus possible, in spite of a common control of the bias currents and a common generation of the controlled bias currents, to set an individual output amplitude range for each of the digital-to-analog current converters.

Figure 2:
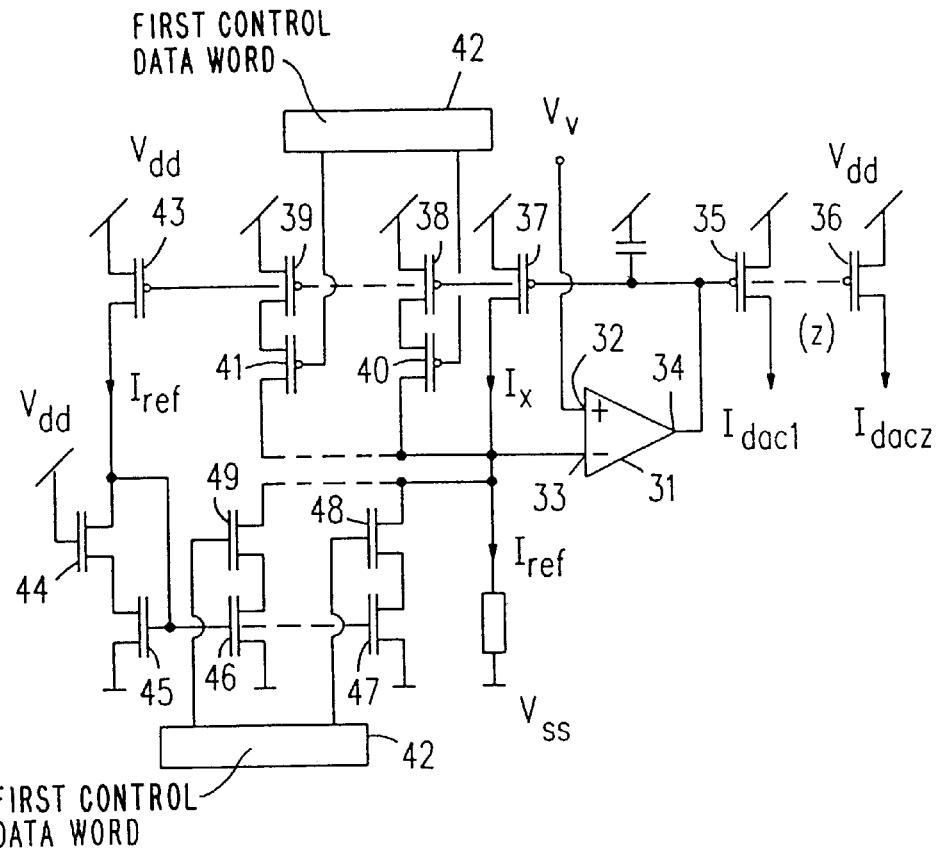
FIG. 2 shows a circuit diagram of a circuit for generating controlled bias currents, as can be used for example in the circuit arrangement shown in FIG. 1.

FIG. 2 shows a circuit for the generation of the controlled bias currents, as can be used for example, in the block 1 shown in FIG. 1.

The circuit shown in FIG. 2 includes an operational amplifier 31 having a non-inverting input 32 to which the comparison voltage $V_v$ is applied. The operational amplifier 31 has an inverting input 33 coupled to the external reference resistor 2, this resistor 2 being connected to a reference potential. A variable reference current $I_{ref}$ flows through the reference resistor 2.

An output 34 of the operational amplifier 31 supplies an output voltage, which is applied to the gate electrodes of PMOS transistors 35 and 36. The source electrodes of these PMOS transistors 35 and 36 are connected to a supply voltage $V_{dd}$. The drain electrodes of these PMOS transistors 35 and 36 supply the controlled bias currents $I_{dac1}$ to $I_{dacz}$, as indicated in FIG. 1.

The output 34 is further coupled to a gate electrode of a further PMOS transistor 37, whose source electrode is also connected to the reference potential $V_{dd}$ and whose drain electrode supplies a current $I_x$ which represents the basic component for the current $I_{ref}$ which flows through the external reference resistor 2.

The circuit described so far with the operational amplifier 31 does not yet allow the controlled bias currents $I_{dac1}$ to $I_{dacz}$ to be varied. For this purpose, further circuitry is used.

The operational amplifier 31 has its output 34 coupled to gate electrodes of further PMOS transistors 38 and 39. The transistors 38 and 39 have their source electrodes coupled to the supply potential $V_{dd}$ and their drain electrodes coupled to drain electrodes of further PMOS transistors 40 and 41. The gate electrodes of the transistors 40 and 41 are switched in dependence on a first control data word 42, which is represented symbolically in the Figure. The drain electrodes of the transistors 40 and 41 thus supply currents which are dependent on the value of the output amplitude on the output 34 of the operational amplifier 31, because the drain electrodes of the transistors 38 and 39 supply a signal which depends on this output amplitude. The drain signals of the transistors 38 and 39 are switched by means of the transistors 40 and 41. This switching is effected in dependence on the value of the first control data word 42. In The areas of the transistors 38 and 39 may then, in particular, be scaled in such a manner that they supply weighted currents. This weighting can, for example, be such that the currents are dimensioned in accordance with the weights of the respective bits of the first control data word 42. For example, if the bit of the first control data word 42, which is coupled to the transistor 41, has twice the weight of the bit coupled to the switch 40, it is advantageous to select the current supplied by the transistor 39 to be also twice as large as that supplied by the transistor 38.

The currents supplied by the PMOS transistors 40 and 41, used as switches, are superposed on the current $I_x$ in the same sense. Thus, the current $I_{ref}$ can be varied in dependence on the value of the first control data word. Further, correspondingly arranged PMOS transistors 38 and 39 and correspondingly associated switches 40 and 41 can be provided whose number depends, for example, on the bit length of the first control data word 42.

The circuit described so far allows the current $I_{ref}$ to be varied in one sense, i.e., he current $I_{ref}$ can be varied in the positive sense. The part of the circuit of FIG. 2 described hereinafter in addition, allows the current $I_{ref}$ to be varied in a negative direction, i.e., it allows the reference current to be reduced.

For this purpose, a further PMOS transistor 43 is used, which has its source electrode coupled to the supply potential $V_{dd}$. The PMOS transistor 43 has its drain electrode coupled to a current mirror circuit whose input section includes NMOS transistors 44 and 45 and whose output section includes NMOS transistors 46 and 47.

The signal supplied by the drain electrode of the PMOS transistor 43 is coupled to the source electrode of the transistor 44, which has its gate electrode coupled to supply potential $V_{dd}$, and to the gate electrode of the NMOS transistor 45, which has its drain electrode coupled to reference potential. Furthermore, the NMOS transistor 44 has its drain electrode couple to the source electrode of the NMOS transistor 45. The gate electrode is coupled to the gate electrodes of the transistors 46 and 47, which have their drain electrodes coupled to reference potential. The arrangement with the transistor 43 and the current mirror circuit guarantees that the transistors 46 and 47 supply currents of the same magnitude as the transistors 38 and 39. In this case it is again advantageous that the transistors 46 and 47 supply weighted currents, which are advantageously selected in dependence on the associated bit of the second control data word 42. The source electrodes of the NMOS transistors 48 and 49 make negative contributions to the current $I_x$, which together with the currents supplied by the transistors 38, 40, 39 and 41 form the total current $I_{ref}$ which flows through the resistor 2.

The transistors 46, 47 and 48, 49 operate in the same way as the transistors 38, 39 and 40, 41, the only difference being that the currents supplied by the first-mentioned transistors cause a reduction of the current $I_{ref}$.

For the transistors 48 and 49, the second control data word 42 may have special bits, but it is also possible to provide a separate control data word for these transistors.

Thus, it is achieved that currents of different polarities are superposed on the current $I_x$ in such a manner that the current $I_{ref}$ is varied.

If the comparison voltage $V_v$ is too large or the value of the resistor 2 is too small, this will result in a reference current $I_{ref}$ which is too large and, consequently, in currents $I_{dac}$ which are too large. Conversely, when these currents are too small if $V_v$ is too small or the resistance of the resistor 2 is too high.

By means of the above variation of the reference current $I_{ref}$ this, can be corrected in that the voltage drop across the resistor 2 is varied by the superposition of the additional currents. This makes it possible to correct values of the supply voltage $V_v$ or of the resistance value of the resistor 2 which deviate from their nominal values in such a manner that the controlled bias currents $I_{dac1}$ and $I_{dacz}$ exhibit the desired values, which would not be the case without the correction in dependence on the second control data word because, as a result of the supply voltage value deviating from the nominal value or the value of the voltage drop across the external resistor 2 deviating from a nominal value, the operational amplifier 31 would supply an incorrect output signal and, as a consequence, the currents $I_{dac1}$ and $I_{dacz}$ would not be generated with the correct magnitude. However, by means of the switched weighted currents, the voltage drop across the resistor 2 can be varied in such a manner that the controlled bias currents $I_{dac1}$ and $I_{dacz}$ exhibit the desired values. Preferably, these values are equal.

Figure 3:
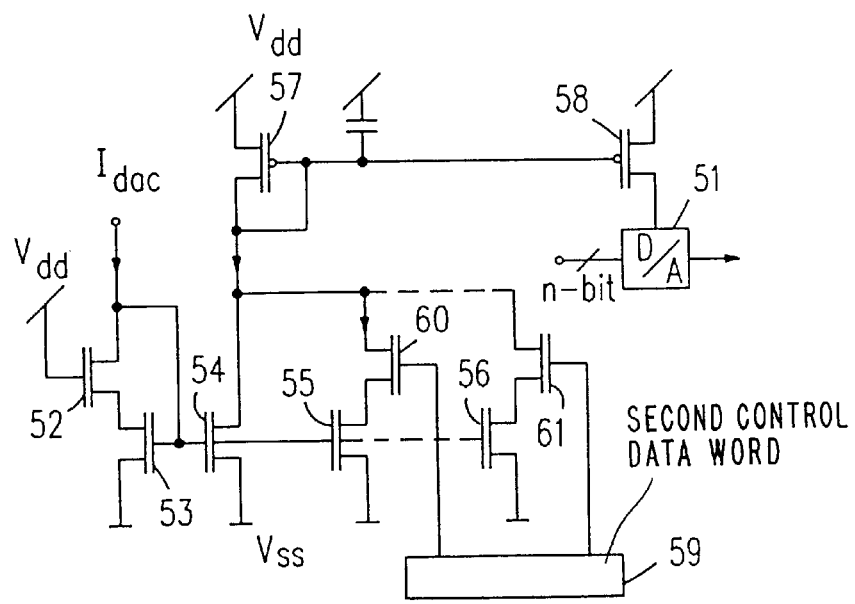
FIG. 3 shows a circuit for setting the output amplitude range, as can be used for example in the circuit arrangement shown in FIG. 1.

FIG. 3 shows a circuit for setting the output amplitude range, as can be used, for example, in the blocks 11 and 21 shown in FIG. 1.

The respective associated current $I_{dac}$ is applied to the input section of the circuit. This current is the controlled bias current generated in the arrangement shown in FIG. 1. This current can be generated for example by means of the circuit shown in FIG. 2.

In the circuit shown in FIG. 3 for setting the output amplitude range, the current $I_{dac}$ is applied to a first current mirror including NMOS transistors 52, 53 in its input section and 54, 55 and 56 in its output section. The arrangement of the transistors 52 and 53 of the input section of the current mirror corresponds to that of the transistors 44 and 45 of the current mirror in the circuit shown in FIG. 2.

In the circuit shown in FIG. 3, the output transistor 54 of the current mirror supplies a current which bears a fixed known ratio to the input current $I_{dac}$, in the present case it is 2 times $I_{dac}$. This current is applied to a second current mirror circuit including a PMOS input transistor 57 and a PMOS output transistor 58. The output transistor 54 has its source electrode coupled to the drain electrode as well as to the gate electrode of the transistor 57. The transistor 57 has its source electrode coupled to the supply potential. The transistors 57 and 58 have their gate electrodes coupled to one another. The transistor 58 has its source electrode coupled to the reference potential. The drain electrode of the transistor 58 leads to a digital-to-analog current converter 51 and supplies this converter with the bias current whose value covers the output amplitude range in dependence on data words applied to the digital-to-analog current converter. The transistor 58 is in principle, a compound transistor whose individual transistors can be switched in a weighted fashion in dependence on a data word DW.

The part of the circuit in FIG. 2 described so far generates a bias current on the drain electrode of the transistor 58, this bias current bearing a given proportion to the current $I_{dac}$ and, in the present case, having twice value of the latter. So far, this controlled bias current applied to the input of the circuit has not undergone any change. For this purpose, the subsequent circuitry has been provided.

The first current mirror includes output transistors 55 and 56 in order to supply weighted currents. For this purpose, these transistors are arranged in a manner similar to the transistor 54. However, the transistors 55 and 56 have their source electrodes coupled to drain electrodes of further transistors 60 and 61 whose gate electrodes are coupled to associated bits of an associated second control data word 59. This means that the transistors 60 and 61 are switched in dependence on the weight of the associated bits of the second control data word 59. The transistors 60 and 61 further have their source electrodes coupled to the input of the second current mirror and thus to the drain electrode and the gate electrode of the transistor 57.

Advantageously, the areas of the transistors 55 and 56 are scaled in such a way that they supply weighted currents, whose weight depending on the weight of those bits in dependence on which the associated transistor 60 or 61 is switched.

Thus, additional currents can be superposed on the input current of the second current mirror in dependence on the second control data word 59 so as to allow a variation of this input current.

A variation of the input current of the second current mirror also causes the output current of this current mirror to vary, which output current is applied to the digital-to-analog current converter 51 as a weighted bias current. In this way, it is possible to vary the controlled bias current $I_{dac}$ in dependence on the value of the second control data word 59 so as to produce a weighted bias current. Again, this bias current can be proportioned in such a manner that a desired amplitude range is established for the output signal of the associated individual digital-to-analog current converters 51.

As already explained herein before with reference to FIG. 1, this weighted can be effected individually, so that, for example, for video uses different swings can be set for different types of analog video signals to be generated.

The circuit arrangement in the present example can also be constructed in an inverse manner in such a way that the output current of the converter 51 does not flow with respect to the reference potential $V_{ss}$ but with respect to the supply potential $V_{dd}$. In that case, the transistors 57 and 58 are, for example, NMOS transistors.

For the purpose of symmetry transistors, corresponding to the transistors 40, 41 and the transistors 60, 61, can be interposed between the transistors 43 and 44 and between the transistors 54 and 57, respectively, as a result of which the response in these paths is the same as in the adjacent paths.

What is claimed is:

1. A circuit arrangement including digital-to-analog current converters having output amplitudes dependent on a value of a digital data word and having amplitude ranges dependent on a value of a bias current applied to the respective converter, characterized in that said circuit arrangement further comprises:

at least one first circuit for generating controlled bias currents for said digital-to-analog converters, said controlled bias currents having variable values dependent on at least a first data word; and at least one second circuit, associated with at least a respective one of the digital-to-analog current converters, for setting the output amplitude range, said second circuit receiving one of the controlled bias currents and supplying a weighted bias current for the associated digital-to-analog current converter other ones of the controlled bias currents being applied to those of the digital-to-analog current converters not associated with a second circuit for setting the output amplitude range, in the second circuits, the applied controlled bias current is variable in dependence on a respective second data word applied to the respective second circuits, which results in the weighted bias current which is applied to the associated digital-to-analog current converter.

2. A circuit arrangement as claimed in claim 1, characterized in that the first circuit for generating the controlled bias currents includes an operational amplifier having a non-inverting input to which a comparison voltage is applied, said operational amplifier supplying an output signal for generating the controlled bias currents and a reference current, said reference current flowing through a reference resistor and producing a voltage drop which is coupled to an inverting input of the operational amplifier, switchable weighted currents being superposable on the reference current in order to control the selectively equal controlled bias currents in dependence on a first control data word.

3. A circuit arrangement as claimed in claim 2, characterized in that the first circuit comprises MOS current mirrors having weighted output currents switchable by MOS transistors in dependence on the first control data word.

4. A circuit arrangement as claimed in claim 2, characterized in that the weighted currents, which are switchable in dependence on the first control data word, are superposable on the reference current with the same sign and/or with different signs.

5. A circuit arrangement as claimed in claim 1, characterized in that the second circuits comprises a MOS current mirror for receiving the controlled bias current, said MOS current mirror including an output transistor for supplying the unaltered controlled bias current, further output transistors for supplying weighted currents which are switchable in dependence on an associated second control data word and associated MOS transistors, said weighted currents being superposed on the controlled bias current so as to form the weighted bias current, which is applied to the respective associated digital-to-analog current converter.

6. A circuit arrangement as claimed in claim 1, characterized in that each of the digital-to-analog current converters for setting the output amplitude range, and the controlled bias currents have equal values.

7. A circuit arrangement as claimed in claim 2, characterized in that the first control data word, which is applied to the first circuit for generating the controlled bias currents, corrects the values of the controlled bias currents in the case that these values deviate from a nominal value due to the reference voltage and/or the reference resistor having values which deviate from the nominal values.

8. A circuit arrangement as claimed in claim 1, characterized in that the second control data words, which are associated with the digital-to-analog current converters or with the second circuits for setting the output amplitude range which are associated with these converters, set amplitude ranges associated with data types converted by the digital-to-analog current converters.

9. A circuit arrangement as claimed in claim 8, characterized in that the second control data words are selected in such a manner that the associated digital-to-analog current converter generates, across a resistor arranged after this converter, a voltage swing of 1 V when a video RGB signal is processed, a voltage swing of 1.16 V when a video Y/C signal is processed, and a voltage swing of 1.23 V when a video CVBS signal is processed.

10. The use of the circuit arrangement as claimed in claim 1 for the analog-to-digital conversion of a picture signal.

* * * * *